(12) United States Patent
Futatsuyama

(10) Patent No.: US 7,504,724 B2
(45) Date of Patent: Mar. 17, 2009

(54) SEMICONDUCTOR DEVICE

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 11/329,101

(22) Filed: Jan. 11, 2006

(65) Prior Publication Data

US 2006/0172567 A1 Aug. 3, 2006

(30) Foreign Application Priority Data

Jan. 11, 2005 (JP) ............................. 2005-003390

(51) Int. Cl.
*H01L 23/12* (2006.01)
(52) U.S. Cl. .................. 257/750; 257/758; 257/762; 257/773; 257/774; 257/775; 257/E23.145; 257/E23.161; 257/E23.168; 257/E21.021
(58) Field of Classification Search ................. 257/621, 257/E21.597, 774, 734–736, 748, 750, 758–770, 257/775, 776, E23.142, E23.143, E23.145, 257/E23.161, E23.168, E23.17, E21.021
See application file for complete search history.

(56) References Cited

U.S. PATENT DOCUMENTS 6,831,000 B2 * 12/2004 Murayama ................... 438/613

FOREIGN PATENT DOCUMENTS

JP 2004-146812 5/2004

* cited by examiner

*Primary Examiner*—Jasmine J Clark
(74) *Attorney, Agent, or Firm*—Oblon, Spivak, McClelland, Maier & Neustadt, P.C.

(57) ABSTRACT

A semiconductor device comprises: a plurality of first wiring lines formed in a first layer with a first wiring width and a first wiring space; a plurality of second wiring lines formed in a second layer different from the above-described first layer with a second wiring width and a second wiring space larger than the above-described first wiring width and first wiring space; and a contact plug connecting the first wiring line and second wiring line. The above-described contact plug is formed over a plurality of adjacent ones of the above-described first wiring lines and has a pattern connecting the plurality of adjacent ones of the above-described first wiring lines and one of the above-described second wiring lines.

20 Claims, 7 Drawing Sheets

SEMICONDUCTOR DEVICE

CROSS-REFERENCE TO PRIOR APPLICATION

This application is based upon and claims the benefit of priority from the prior Japanese Patent Application No. 2005-3390, filed on Jan. 11, 2005, the entire content of which is incorporated herein by reference.

BACKGROUND OF THE INVENTION

1. Field of the Invention

The present invention relates to a semiconductor device, and more particularly, to a semiconductor device including a contact plug connecting multilayer wiring lines formed with a fine wiring width and a fine wiring space.

2. Description of the Related Art

Requests for smaller semiconductor elements have developed the multilayered wiring lines in the semiconductor devices. A contact plug embedded in the contact hole formed in the interlayer insulating film connects the multilayered wiring lines (see, for example, Japanese application patent laid-open publication No. 2004-146812).

SUMMARY OF THE INVENTION

A semiconductor device according to the present invention comprises: a plurality of first wiring lines formed in a first layer with a first wiring width and a first wiring space; a plurality of second wiring lines formed in a second layer different from the above-described first layer with a second wiring width and a second wiring space larger than the above-described first wiring width and first wiring space; and a contact plug connecting the first wiring line and second wiring line, wherein the above-described contact plug is formed over a plurality of adjacent ones of the above-described first wiring lines and has a pattern connecting the plurality of adjacent ones of the above-described first wiring lines and one of the above-described second wiring lines.

DETAILED DESCRIPTION OF THE INVENTION

Along with the requests for smaller semiconductor elements, it has also been requested that each wiring line has less wiring width and wiring space. It has recently been proposed, for example, that NAND type EEPROM has the minimum processing dimension (the wiring width of and wiring space between the word lines, bit lines, or the like) less than 70 nm. When such fine-wiring layers and other wiring layers are connected via contact plugs, it is difficult to ensure a sufficient size of the above-described contact fringe, because resolution of photolithography is limited. It is thus desirable that the wiring line pattern with the minimum processing dimension includes wiring layers which are equally spaced with no contact fringes or the like and are provided in a straight line without changing the wiring width near the contact fringe.

The contact plugs and their upper-layer wiring layers of use for power supply lines or global wiring lines are, on the other hand, not sufficiently scaled down. The upper-layer wiring layer and the contact plug need to have a larger thickness. It is because the upper-layer wiring line with a larger thickness can have lower wiring resistance and the contact plug with a larger thickness can generate lower capacitance between the upper and lower layer wiring lines. The larger thickness of the wiring line and contact plug cause necessity of providing a larger wiring width and an wiring space and a larger contact-plug diameter (size) and space due to the constrained aspect ratio of processing and constrained process cost.

The wiring line made of copper (Cu) (Cu wiring line) has been attempted to reduce the wiring resistance, which has, however, limited effect. In recent NAND type EEPROMS, the width of the upper-layer wiring layer and the diameter of the contact plug of use for the power supply line or global wiring lines are twice the minimum processing dimension or more.

In this way, in the recent semiconductor devices, the reducing trend of the contact-plug size is less than that of the wiring width to which the minimum processing dimension is applied, and the wiring pattern to which the minimum processing dimension is applied needs to have periodicity so that it cannot ensure the contact fringe or the like. In such circumstances, one contact plug is connected to one minimum-width wiring line with the contact plug extended off the minimum-width wiring line. With such connections, however, the positioning error during the lithography or variation of the processed shape may cause an unexpected short circuit between the contact plug and adjacent another minimum-width wiring line, which easily leads to connection errors.

With reference to the accompanying drawings, embodiments of the invention will be described below.

Figure 1:
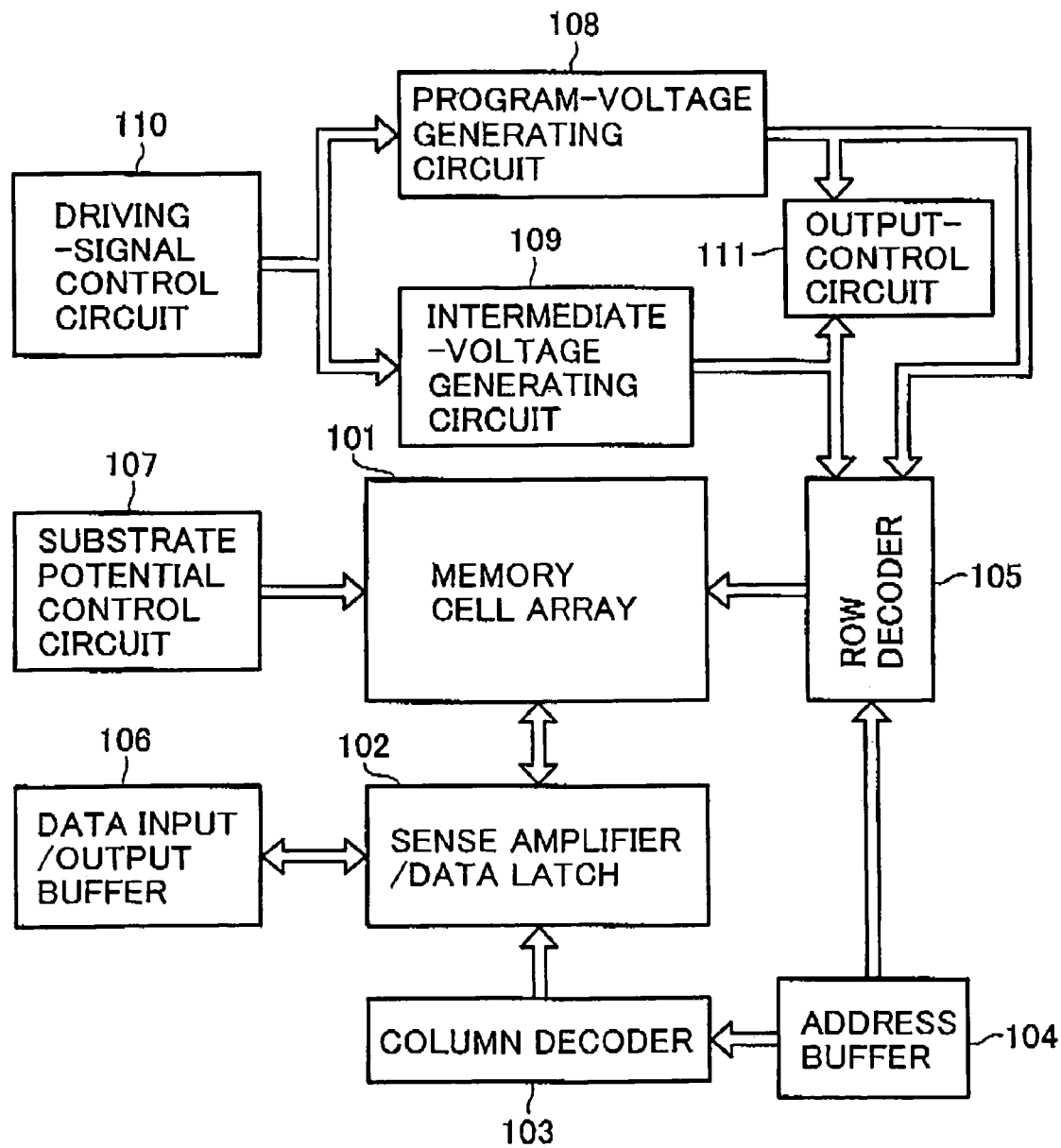
FIG. 1 shows a block configuration of NAND cell type EEPROM according to an embodiment of the present invention.

FIG. 1 shows a block configuration of NAND cell type EEPROM as an example according to an embodiment of the present invention. Memory-cell array 101 includes NAND cells arranged in a matrix with each cell including nonvolatile memory cells connected in series, as described below. Sense amplifier/data latch 102 is provided which senses the bit-line data of memory-cell array 101 or stores and provides the programming data to the bit line.

Sense amplifier/data latch 102 connects to data input/output buffer 106. The connection between sense amplifier/data latch 102 and data input/output buffer 106 is controlled by the output of column decoder 103 which receives the address signal from address buffer 104. Row decoder 105 is provided to memory-cell array 101, which selects the memory cell, more specifically, controls the control gate and the select gate.

Substrate-potential control circuit 107 is provided to control the potential of p-type well in which memory-cell array 101 is formed.

Programming voltage generating circuit 108 is provided which generates a programming voltage pumped up from the power-supply voltage during data-programming in the selected memory cell of memory-cell array 101. In addition to programming voltage generating circuit 108, intermediate-voltage generating circuit 109 is provided which generates an intermediate voltage given to the control gate of the non-selected memory cell during data-programming. Intermediate-voltage generating circuit 109 generates an intermediate voltage which is pumped up from the power-supply voltage and is lower than the above-described programming voltage.

Driving-signal control circuit 110 is provided which controls those programming voltage generating circuit 108 and intermediate-voltage generating circuit 109. Further, output-control circuit 111 is provided which controls the output voltage of programming voltage generating circuit 108 and the output voltage of intermediate-voltage generating circuit 109.

Figure 2:
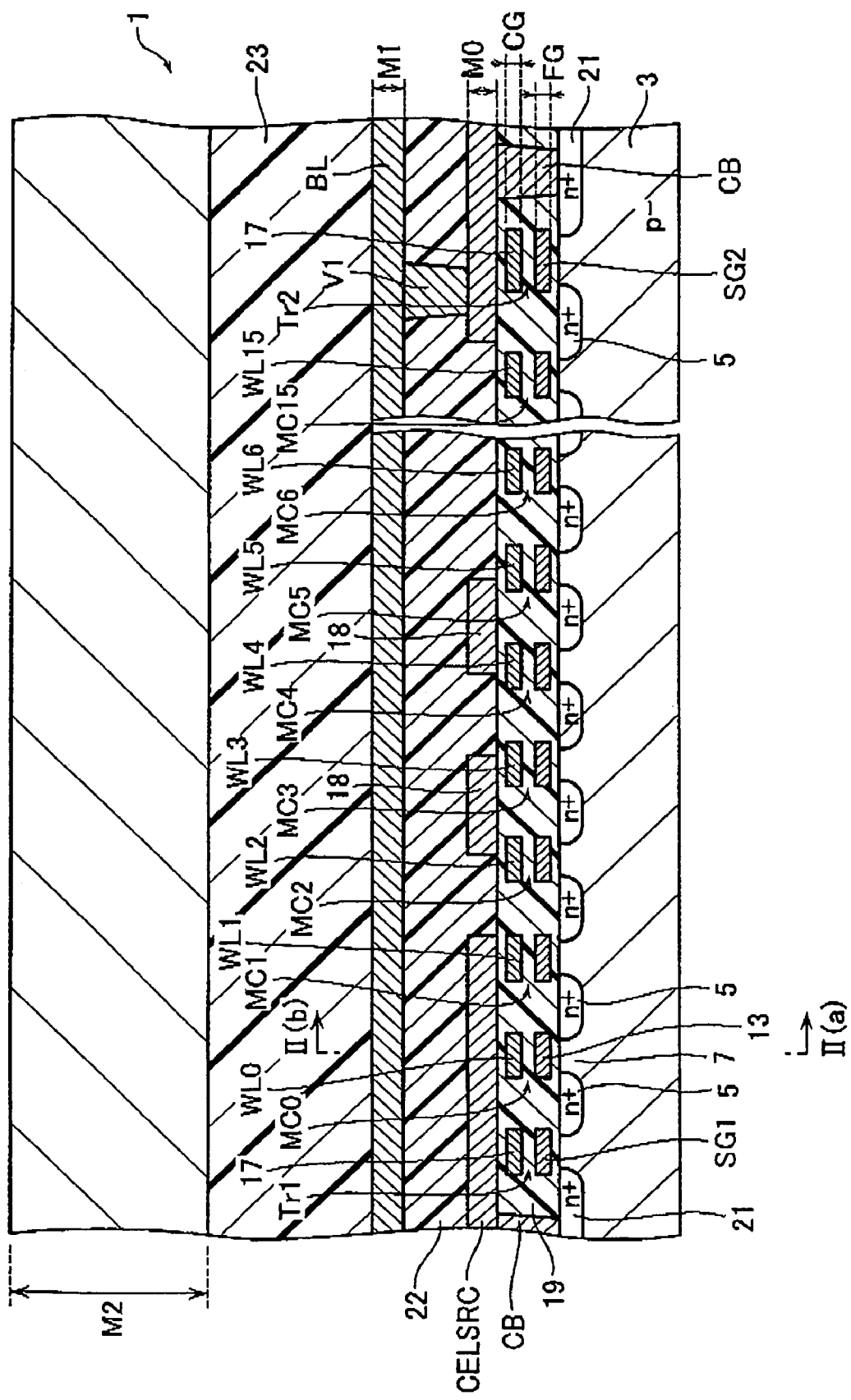
FIG. 2 shows a cross sectional view of one NAND cell portion of memory-cell array 101.
Figure 3:
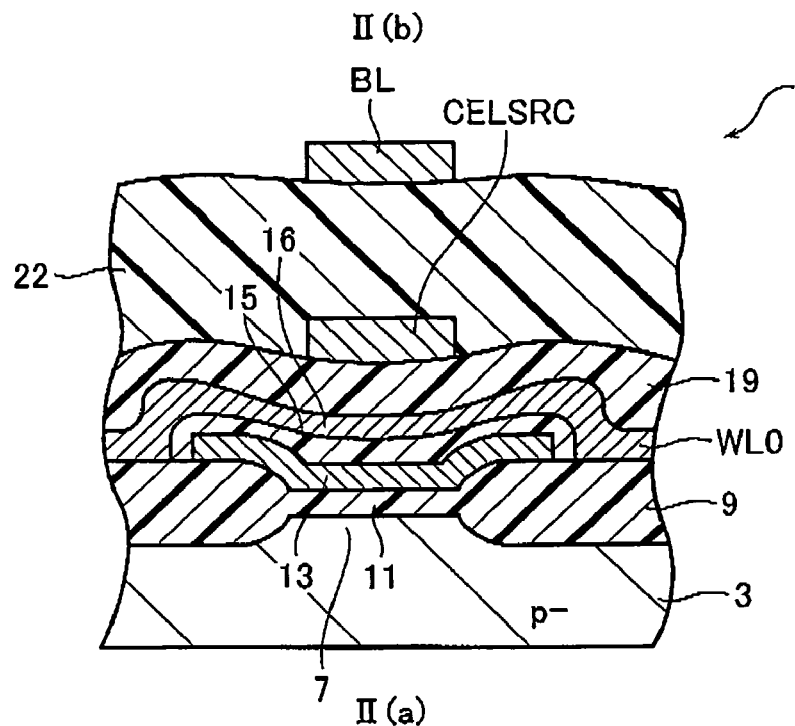
FIG. 3 shows a cross sectional view taken along line II (a)-II (b) in FIG. 2.
Figure 4:
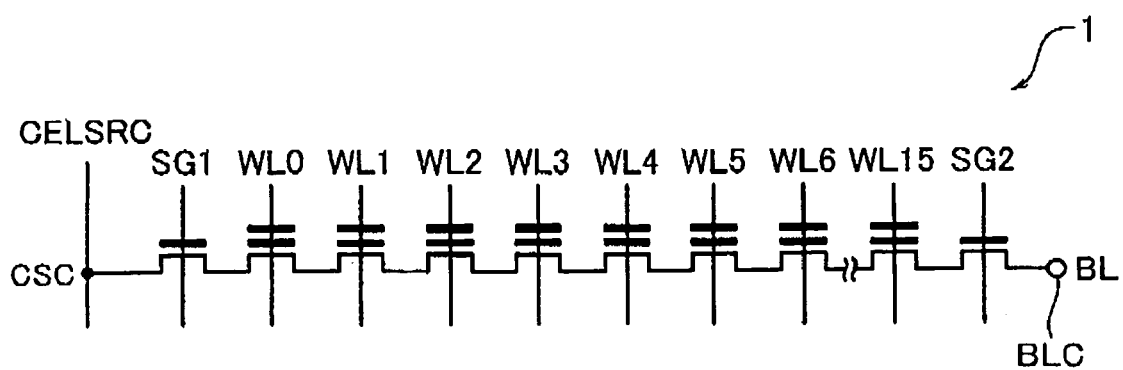
FIG. 4 shows an equivalent circuit diagram of the NAND cell in FIG. 2.

FIG. 2 shows a cross sectional view of a given NAND cell portion of memory-cell array 101. FIG. 3 shows a cross sectional view taken along line II (a)-II (b) in FIG. 2. FIG. 4 shows an equivalent circuit diagram of the NAND cell shown in FIG. 2.

As shown in FIG. 2 to FIG. 4, NAND cell 1 includes 16 memory cells of MC0 to MC15 formed in the p-type well. Each memory cell MC has the same configuration which includes n+ type diffusion regions 5 (source/drain) spaced with a predetermined distance in the surface of substrate 3, channel regions 7 in the portions of substrate 3 that are positioned between diffusion regions 5, field-isolation insulating film 9 formed around regions 5 and 7, floating gates 13 formed via gate insulating film 11 on channel regions 7, and word lines WL formed via insulating film 15 on floating gates 13, which WL is extending in a predetermined direction. The portion of word line WL that is positioned over floating gate 13 act as control gate 16.

Note that, in FIG. 2, floating-gate layer FG shows a charge-storage layer in which floating gate 13 is formed, and control-gate layer CG shows a conductive layer in which control gate 16 is formed.

NAND cell 1 includes 16 memory cells of MC0 to MC15 connected in series, with adjacent cells sharing source/drain diffusion layer 5. This specification illustrates NAND cell 1 including 16 memory cells, but NAND cell 1 may include different numbers of memory cells such as 8, 32, and 64 memory cells.

On the memory cell MC0 side is formed select transistor Tr1 which has select gate line SG1. Select transistor Tr1 controls the connection/separation between NAND cell 1 and common source line CELSRC.

On the memory cell MC15 side, on the other hand, is formed select transistor Tr2 which has select gate line SG2. Select transistor Tr2 controls the connection/separation between NAND cell 1 and bit line BL. Note that conductive film 17 is formed over select gate lines SG1 and SG2. Conductive film 17 may connect to select gate lines SG1 and SG2 or may be in a floating state. The word line has the minimum wiring width and minimum wiring space to which the minimum processing dimension is applied.

The first interlayer insulating film 19 is formed covering memory cells MC0 to MC15 and select transistors Tr1 and Tr2. M0 wiring line is formed over first interlayer insulating film 19. M0 wiring line is the bottom-layer wiring line which provides various wiring lines from the active areas such as diffusion region 5 via contact plug CB. For example, M0 wiring line is used as a portion of common source line CELSRC, as shown in FIG. 2. M0 wiring line used as common source line CELSRC connects via contact plug CB to n+ type diffusion region 21 forming a part of select transistor Tr1. Common source line CELSRC goes to the outside of the memory-cell array through M1 wiring line, M2 wiring line, and the contact plug therebetween as described below.

Second interlayer insulating film 22 is formed covering M0 wiring line and first interlayer insulating film 19. M1 wiring line is formed over second interlayer insulating film 22. M1 wiring line is used mainly as bit line BL and has the minimum wiring width and minimum wiring space to which the minimum processing dimension is applied. M1 wiring line used as bit line BL connects via contact plug V1 to underlying M0 wiring line. M0 wiring line, in turn, electrically connects via contact plug CB to diffusion region 21 at one end of select transistor Tr2, thereby making bit line BL connected to select transistor Tr2.

M2 wiring line is formed via the third interlayer insulating film 23 on M1 wiring line. M2 wiring line is used for such as the power-supply line, common source line CELSRC, and global wiring line. M2 wiring line has a longer wiring length and flows larger current. To achieve the lower wiring resistance, therefore, M2 wiring line is desirably thicker than the underlying M1 wiring line and has the minimum line width about five to six times as much as the minimum processing dimension due to the constrained aspect ratio or the like.

Although not shown in FIG. 2, M2 wiring line for common source line CELSRC connects to M1 wiring line via contact plug V2, and the large difference between the size of M1 wiring line width and the size of contact plug V2 and M2 wiring line allows one M2 wiring line to connect to a plurality of M1 wiring lines via one contact plug V2. Note that materials for M0 wiring line, M1 wiring line, and M2 wiring line include tungsten (W) or aluminum (Al) as the most common ones, but at least one of M0 wiring line, M1 wiring line, and M2 wiring line can be formed of copper (Cu) to provide a less wiring width and lower resistivity.

Figure 5:
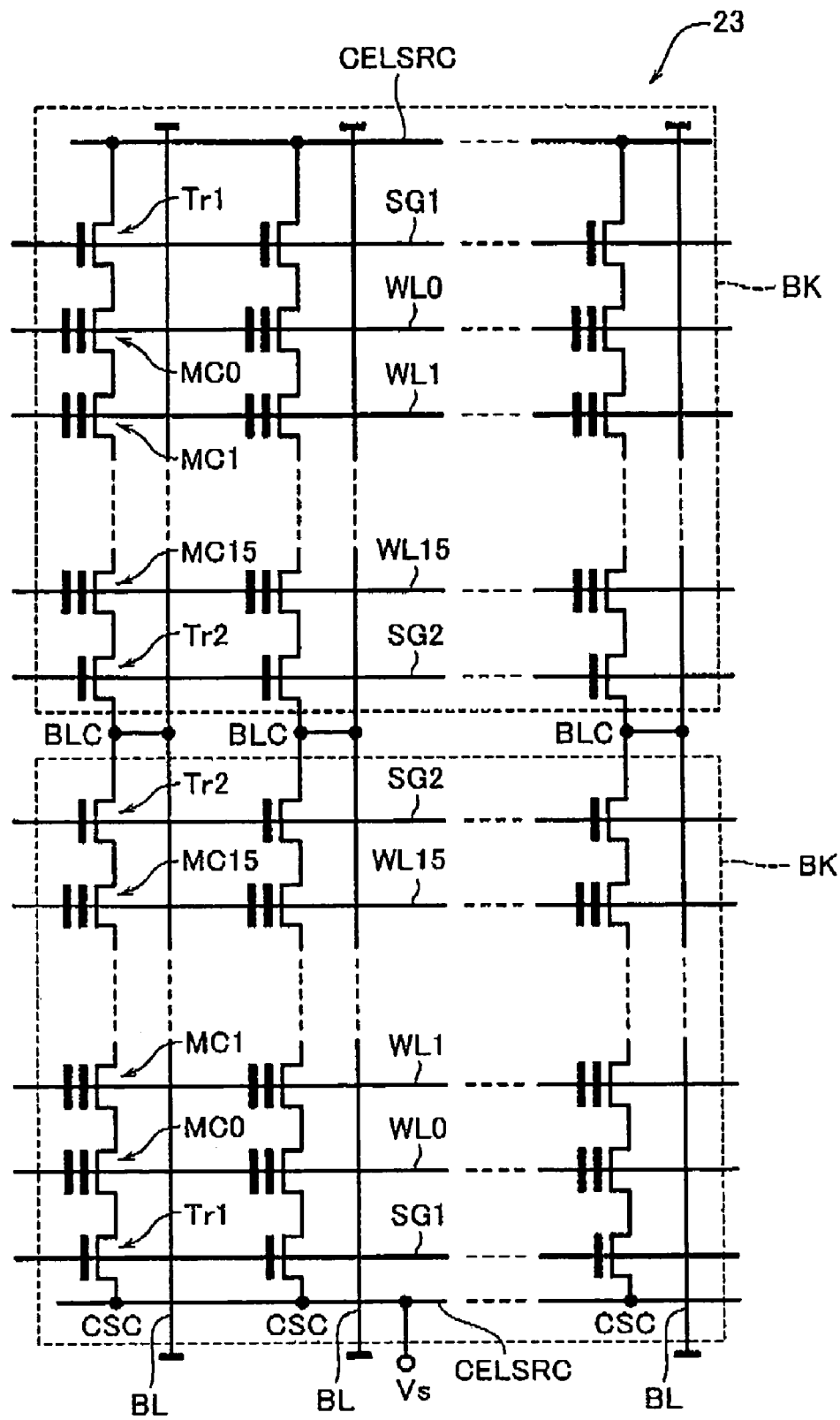
FIG. 5 shows an equivalent circuit of memory-cell array 101 including NAND cells arranged in a matrix.

FIG. 5 shows an equivalent circuit of memory-cell array 101 including such NAND cells arranged in a matrix. NAND cell group in a region surrounded by a broken line is referred to as a block. Selecting one of a plurality of the blocks usually performs the reading or programming operation.

Figure 6:
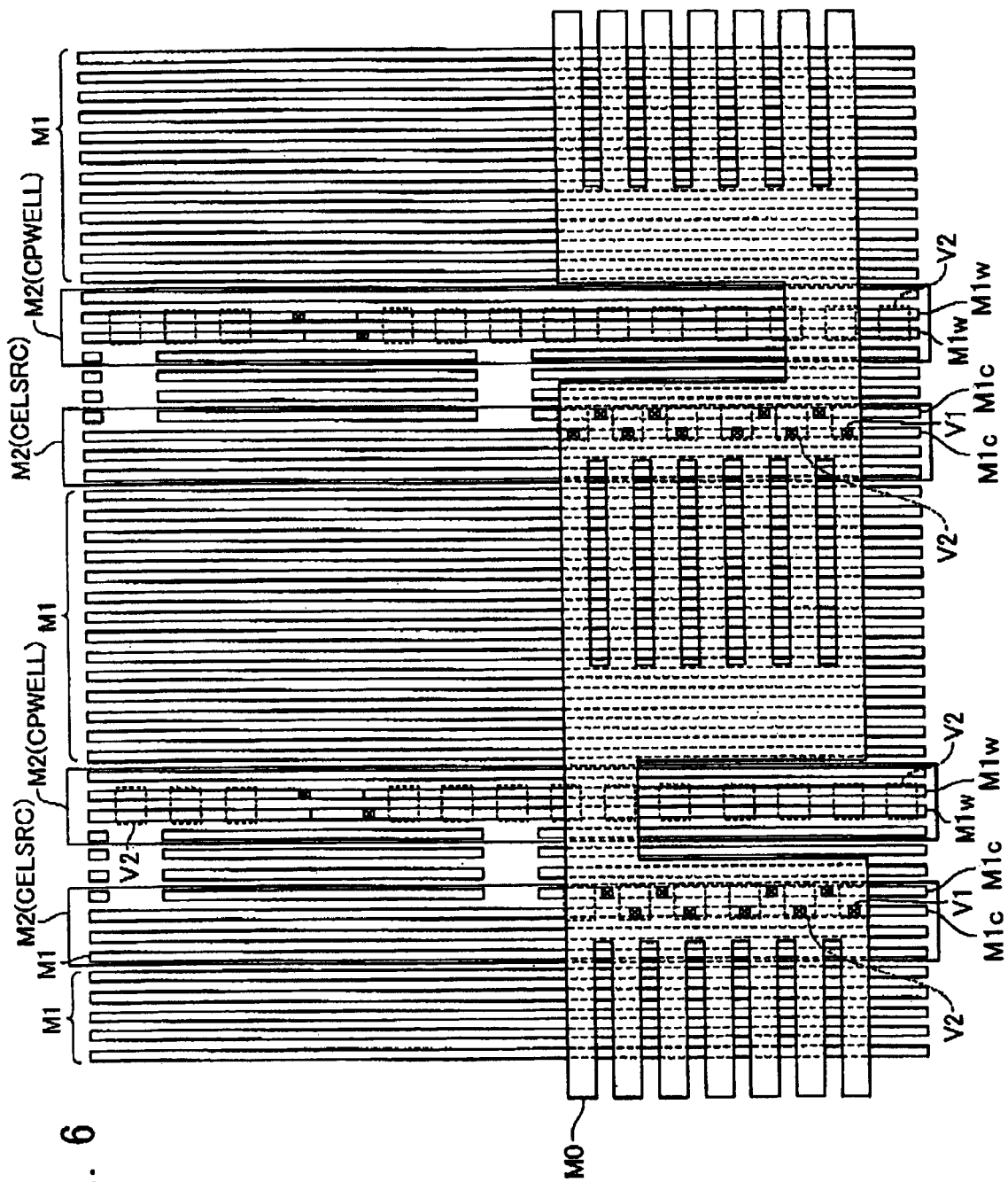
FIG. 6 shows a plan view illustrating a layout example of multilayer wiring lines including M0 wiring line, M1 wiring line, and M2 wiring line, and contact plug V1 connecting M0 and M1, and contact plug V2 connecting M1 and M2, according to this embodiment.
Figure 7:
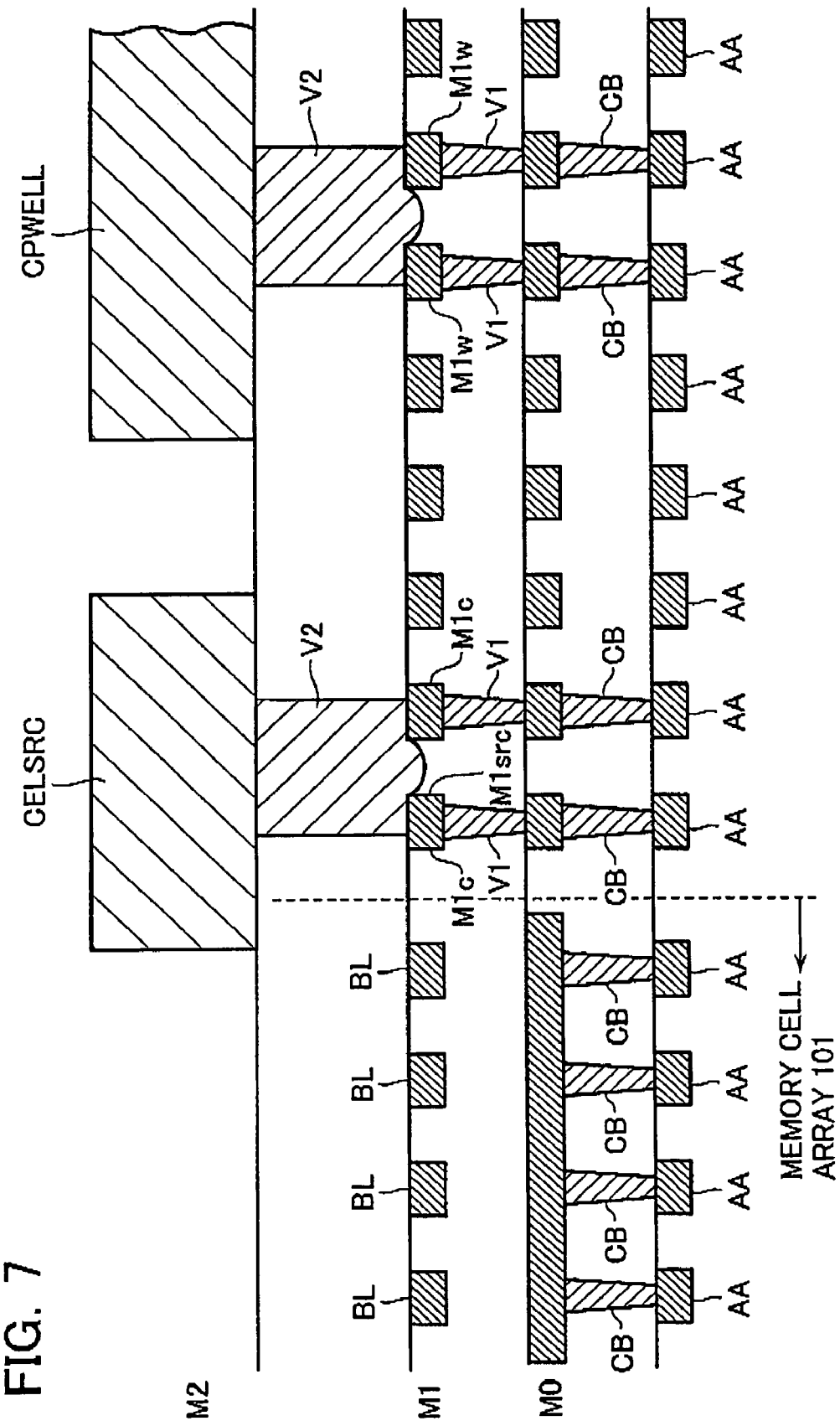
FIG. 7 shows a schematic view of cross sectional structures of M0 to M2 wiring lines and contact plugs V1 and V2.

FIG. 6 shows a plan view illustrating a layout example of multilayer wiring lines including M0 wiring line, M1 wiring line, and M2 wiring line, contact plug V1 connecting M0 and M1, and contact plug V2 connecting M1 and M2, according to this embodiment. In particular, FIG. 6 shows the structures of common source line CELSRC and cell well line CPWELL. Cell well line CPWELL connects to the p-type well of memory-cell array 101 from substrate potential control circuit 107. FIG. 7 shows a schematic view of those cross sectional structures. Note that FIG. 6 shows the bottom M0 wiring line at the top and the top M2 wiring line at the bottom, and omits contact plug CB and active areas. FIG. 7 also shows M1 wiring line and M2 wiring line extending in the direction perpendicular to the plane of FIG. 7 (normal direction of the paper plane).

As shown in FIG. 6, M1 wiring line is formed above M0 wiring line and below M2 wiring line, and has the minimum wiring width and minimum wiring space to which the minimum processing dimension is applied. M1 wiring lines are thus equally spaced in a straight line without changing the wiring width near the contact fringe (see FIG. 6).

M2 wiring line is, on the other hand, upper-layer wiring line of M1 wiring line, and is used for common source line CELSRC or global lines such as a power-supply line. M2 wiring line flows larger current so that it needs to have electrical resistance as low as possible and be formed as thick as possible. M2 wiring line thus has a larger width and a larger space than M1 wiring line. Contact plug V2 connecting M1 wiring line and M2 wiring line also needs to have a large thickness to reduce capacitance between M1 wiring line and M2 wiring line. V2 thus has a larger size than V1. For example, if the wiring width of M1 wiring line and the size of contact plug V1 are about 60 nm, contact plug V2 may have the size of about 180 nm which is about three times as large as 60 nm, and M2 wiring line have the width of about 300 nm which is about five times as large as 60 nm.

In view of such a large width differences, this embodiment forms one contact plug V2 over two M1 wiring lines. For example, focusing attention on M2 wiring line portion that is common source line CELSRC, M2 wiring line that is common source line CELSRC connects to contact plug V2 which is formed over two M1 wiring lines M1src. Likewise, focusing attention on M2 wiring line that is cell well line CPWELL, M2 wiring line that is cell well line CPWELL connects to contact plug V2 which is formed over two M1 wiring lines M1ws.

The fabrication process of contact plug V2 will be briefly described. First, third interlayer insulating film 23 is formed over M1 wiring line, and then a contact hole is formed by photolithography in third interlayer insulating film 23 over two M1 wiring lines. Subsequently, a barrier metal (such as TiN) is deposited on the surface including the internal of the contact hole, and then a metal layer (for example Al) or the like is formed. The barrier metal and metal layer provide the conductor portions of V2 and M2. Subsequently, M2 wiring line is formed by photolithography or the like. Note that contact plug V2 has a bottom shape which coincides with the space portion between M1 wiring lines (which space portion corresponds to the center of the bottom surface of V2 in this case) and has a protrusion which is convex downward. It is because the silicon oxide film of which third interlayer insulating film 23 is made has a higher etching rate than metals (such as Al and Cu) of which M1 wiring line is made.

Figure 8:
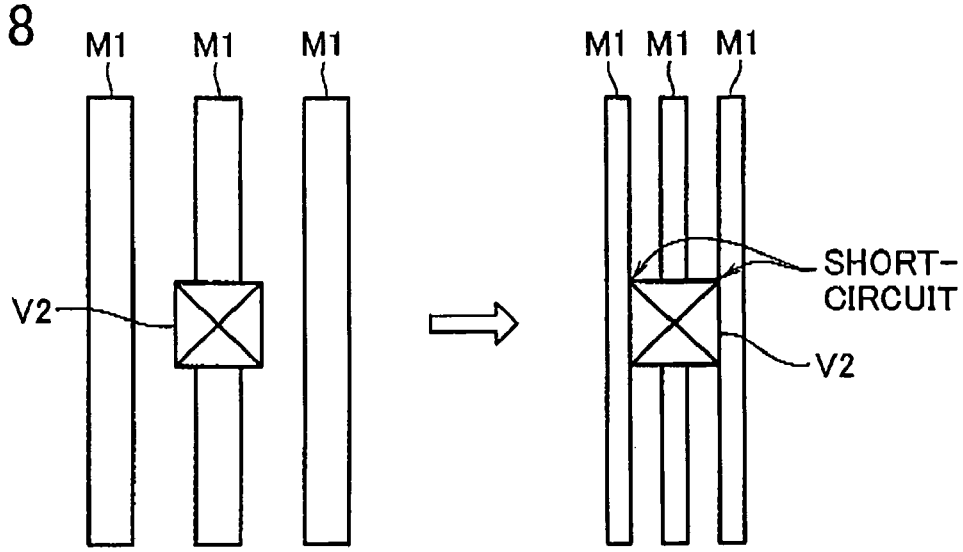
FIG. 8 shows one contact plug V2 connected to one M1 wiring line.
Figure 9:
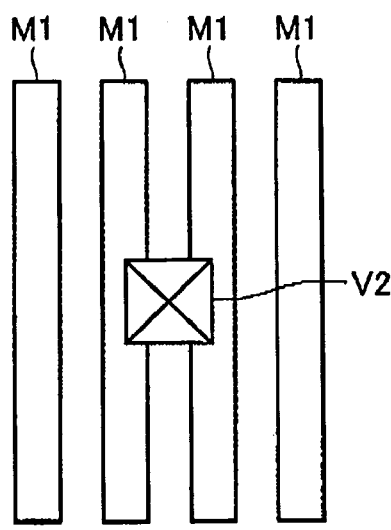
FIG. 9 shows one contact plug V2 formed over two M1 wiring lines.

In this way, contact plug V2 is laid out in such a way that one M2 wiring line connects to two M1 wiring lines via one contact plug V2. More specifically, contact plug V2 is formed in such a way that the center position of contact plug V2 is positioned at an intermediate position between two M1 wiring lines, and the end portion of contact plug V2 generally coincides with the internal portions or external end portions of two M1 wiring lines. If contact plug V2 is to be connected to one M1 wiring line without taking into account the large width difference, as shown in FIG. 8, any misalignment of photolithography or any variation of the processed shape or the like may cause contact plug V2 to short-circuit two M1 wiring lines. This embodiment forms one contact plug V2 over two adjacent M1 wiring lines, as shown in FIG. 9, thereby preventing the unexpected short circuit between adjacent M1 wiring lines due to some processing fluctuation.

Figure 10:
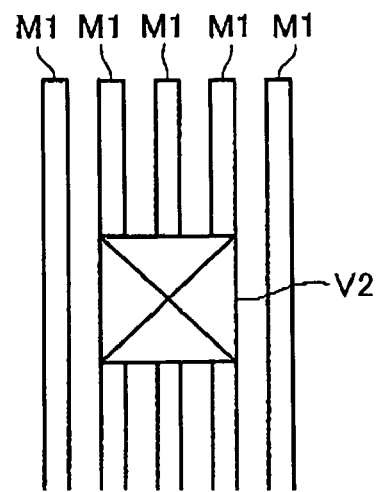
FIG. 10 shows one contact plug V2 formed over three M1 wiring lines.

Although the present invention has been described with reference to particular embodiments thereof, it is not limited to those embodiments, and various modifications, additions, and substitutions or the like might be made without departing from the spirit of the invention. For example, one contact plug V2 can be formed over three M1 wiring lines (see FIG. 10) or more, in addition to two M1 wiring lines. For three M1 wiring lines as shown in FIG. 10, contact plug V2 is formed in such a way that the center of contact plug V2 coincides with the central one of the three M1 wiring lines and the end portion of contact plug V2 coincides with the internal portions or external end portions of the two outer ones of the three M1 wiring lines.

Although the above-mentioned embodiments illustrate NAND type EEPROM, this invention is of course applicable to various other semiconductor devices in which finer wiring lines have been developed, such as NOR type EEPROM, DINOR type EEPROM, AND type EEPROM, or 3Tr-NAND type EEPROM.

What is claimed is:

1. A semiconductor device comprising:
   a plurality of first wiring lines formed in a first layer with a first wiring width and a first wiring space;
   a plurality of second wiring lines formed in a second layer different from said first layer with a second wiring width and a second wiring space larger than said first wiring width and first wiring space; and
   a plurality of contact plugs connecting the first wiring lines and the second wiring lines,
   wherein
   each of said plurality of contact plugs is formed over a plurality of adjacent ones of said first wiring lines and has a pattern connecting the plurality of adjacent ones of said first wiring lines and one of said second wiring lines.

2. A semiconductor device according to claim 1, wherein each contact plug has a protrusion which coincides with a space portion between said first wiring lines.

3. A semiconductor device according to claim 2, wherein an interlayer insulating film formed between a plurality of said first wiring lines has a higher etching rate than said first wiring line.

4. A semiconductor device according to claim 3, wherein said interlayer insulating film is made of silicon oxide film, and
   said first wiring lines are made of any one of aluminum (Al), tungsten (W), or copper (Cu).

5. A semiconductor device according to claim 1, wherein the center of each contact plug generally coincides with a center of a space between two adjacent ones of said first wiring lines, and
   an end portion of each contact plug is positioned at end portions or internal portions of the two adjacent ones of said first wiring lines.

6. A semiconductor device according to claim 1, wherein
   a center of each contact plug generally coincides with a center of a position of a central one of three adjacent ones of said first wiring lines, and
   an end portion of each contact plug generally coincides with positions of remaining two ones of the adjacent three ones of said first wiring lines.

7. A semiconductor device according to claim 1, wherein said second wiring width and second wiring space are about five to six times as large as said first wiring width and first wiring space.

8. A semiconductor device according to claim 6, wherein a minimum processing dimension is applied to said first wiring width and first wiring space.

9. A semiconductor device according to claim 1, wherein
   said semiconductor device is a nonvolatile semiconductor memory device,
   a bit line is made with one of said first wiring lines, and
   a cell source line is made with one of said first wiring lines and one of said second wiring lines connected by one of said contact plugs.

10. A semiconductor device according to claim 9, wherein said semiconductor device is NAND type EEPROM.

11. A semiconductor device according to claim 10, wherein said one of said contact plugs has a protrusion which coincides with a space portion between said first wiring lines.

12. A semiconductor device according to claim 9, wherein said semiconductor device is a nonvolatile semiconductor memory device,
a bit line is made with one of said first wiring lines, and
a cell well line is made with one of said first wiring lines and one of said second wiring lines connected by one of said contact plugs.

13. A semiconductor device according to claim 12, wherein said semiconductor device is NAND type EEPROM.

14. A semiconductor device according to claim 13, wherein said one of said contact plugs has a protrusion which coincides with a space portion between said first wiring lines.

15. A semiconductor device according to claim 1, wherein said second wiring lines are formed above said first wiring lines.

16. A semiconductor device according to claim 1, wherein at least one of said first wiring lines and said second wiring lines is made of copper (Cu).

17. A semiconductor device according to claim 1, wherein at least one of said first wiring lines and said second wiring lines is made of tungsten (W).

18. A semiconductor device according to claim 1, wherein at least one of said first wiring lines and said second wiring lines is made of aluminum (Al).

19. A semiconductor device according to claim 1, wherein said first wiring lines are equally spaced at the minimum wiring width in a straight line.

20. A semiconductor device according to claim 1,
further comprising a plurality of third wiring lines formed under said plurality of first wiring lines with the same wiring width and the same wiring space as said said first wiring width and first wiring space,
wherein each contact plug connecting said first wiring lines and said third wiring lines has a larger size than the contact plugs connecting said first wiring lines and said second wiring lines.

* * * * *